(12) United States Patent
Kawagoshi

(10) Patent No.: US 7,236,042 B2
(45) Date of Patent: Jun. 26, 2007

(54) FUSE TRIMMING CIRCUIT

(75) Inventor: Hirokazu Kawagoshi, Ohtsu (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/212,776

(22) Filed: Aug. 29, 2005

(65) Prior Publication Data
US 2006/0044050 A1 Mar. 2, 2006

(30) Foreign Application Priority Data
Aug. 31, 2004 (JP) ............................ 2004-251359

(51) Int. Cl.
H01H 37/76 (2006.01)
(52) U.S. Cl. ....................................... 327/525; 326/37
(58) Field of Classification Search ..................... None
See application file for complete search history.

(56) References Cited
U.S. PATENT DOCUMENTS
5,731,733 A * 3/1998 Denham ..................... 327/525
6,617,875 B2 * 9/2003 El-Ayat ........................ 326/38

FOREIGN PATENT DOCUMENTS
JP 2000-133778 5/2000

* cited by examiner

Primary Examiner—Timothy P. Callahan
Assistant Examiner—Terry L. Englund
(74) Attorney, Agent, or Firm—Young & Thompson

(57) ABSTRACT

To prevent blowing of a fuse resistor due to application of static electricity to a trimming pad. In a fuse trimming circuit capable of switching the input level of a CMOS input circuit by supplying a voltage or a current to a trimming pad so as to blow a fuse resistor, a P-channel MOS transistor is inserted and connected between the trimming pad and the fuse resistor, and the MOS transistor is controlled to be turned on at a time of trimming. Thus, at the time of the trimming, electrical connection can be established between the trimming pad and the fuse resistor. At all times except the time of the trimming, electrical disconnection can be performed between the trimming pad and the fuse resistor if a control signal is not supplied to the control pad. Further, the parasitic diode of the MOS transistor functions as a static protection diode.

4 Claims, 4 Drawing Sheets ically integrated circuit (IC) (refer to Patent Document 1, for
FUSE TRIMMING CIRCUIT

FIELD OF THE INVENTION

The present invention relates to a fuse trimming circuit.

BACKGROUND OF THE INVENTION

Fuse trimming circuits are employed for improving the output accuracy of an internal circuit in a semiconductor integrated circuit (IC) (refer to Patent Document 1, for example). A description will be directed to a conventional fuse trimming circuit, with reference to FIG. 5. A fuse trimming circuit 10 includes a CMOS input circuit 11, a fuse resistor 12, a trimming pad 13, a P-channel MOS transistor 14, and N-channel MOS transistors 15 and 16 for static protection. The fuse resistor 12 can be blown by application of a voltage or a current and pulls down a level at the input terminal of the CMOS input circuit 11 to a ground potential GND in an unblown state. The voltage or the current for blowing the fuse resistor 12 is supplied to the trimming pad 13. The P-channel MOS transistor 14 pulls up the level at the input terminal of the CMOS input circuit 11 to a power supply potential VDD in a state where the fuse resistor 12 is blown.

One end of the fuse resistor 12 is connected to the input terminal of the CMOS input circuit 11, and the other end of the fuse resistor 12 is connected to a ground line GND. The trimming pad 13 is connected to the one end of the fuse resistor 12. The source of the MOS transistor 14 is connected to a power supply line VDD. The drain of the MOS transistor 14 is connected to the input terminal of the CMOS input circuit 11. The gate of the MOS transistor 14 is connected to the ground line GND. The drain of the MOS transistor 15 is connected to the power supply line VDD. The source of the MOS transistor 15 is connected to the input terminal of the CMOS input terminal 11. The gate of the MOS transistor 15 is connected to the ground line GND. The drain of the MOS transistor 16 is connected to the input terminal of the CMOS input circuit 11. The source and gate of the MOS transistor 16 are connected to the ground line GND.

When trimming is unnecessary in the fuse trimming circuit 10, the fuse resistor 12 is not blown. Thus, the input terminal of the CMOS input circuit 11 is fixed at an "L" level (the GND potential). When the trimming is necessary, the predetermined voltage or current is supplied to the trimming pad 13, thereby blowing the fuse resistor 12. Thus, the input terminal of the CMOS input circuit 11 is fixed at an "H" level (the VDD potential).

[Patent Document 1]
JP Patent Kokai Publication No. JP-P2000-133778A (FIG. 2)

SUMMARY OF THE DISCLOSURE

When a circuit for driving a display panel of a display device of portable information devices such as a cellular phone and a portable information terminal (PDA: Personal Digital Assistants) is made into an IC, it is a common practice to include a power supply circuit in an IC chip thereof. This power supply circuit is constituted from a voltage booster circuit, a voltage regulator circuit, and the like. Recently, it is required that the accuracy of the output voltage of the voltage regulator circuit that constitutes the power supply circuit is ±3% or less. In order to meet this requirement, the output of a reference voltage generation circuit constituted from a band-gap reference circuit (BGR) included in the voltage regulator circuit is trimmed using the fuse trimming circuit, thereby obtaining the output of the reference voltage generation circuit with a high accuracy.

The IC chip for driving the display panel is sometimes mounted on the display panel using a chip-on-glass (COG) technique. This IC chip for COG mounting is normally formed in a state in which gold bumps are exposed on an input/output pad and a power supply pad. This IC chip is directly COG-mounted in the state where the gold bumps are exposed. For this reason, an electro static discharge (ESD: Electro Static Discharge) surge may be applied to the gold bumps exposed after the mounting of the IC chip.

A problem encountered when the fuse trimming circuit 10 is applied to the band-gap reference circuit of the IC chip described above and the IC chip is used for the COG mounting will be described below. In this case, a gold bump is formed in an exposed state on the trimming pad 13 of the fuse trimming circuit 10 as well, and with the state in which this gold bump is also exposed, the IC chip is directly COG-mounted. Further, the trimming is performed in the state of a wafer, and the IC chip is mounted in a state where the fuse resistor 12 for which the trimming is not required is not blown. When an ESD surge is applied to the gold bump exposed on the trimming pad 13 after the IC chip has been mounted, an ESD surge current flows to the power supply line VDD or/and the ground line GND through the fuse resistor 12, from the trimming pad 13. Then, the fuse resistor 12 may be blown, depending on the magnitude of the ESD surge or the time of continuation of the ESD surge.

Thus there is much to be desired in the art.

(1) According to one aspect of the present invention there is provided a fuse trimming circuit capable of switching the input level of a CMOS input circuit by supplying a voltage or a current to a trimming pad so as to blow a fuse resistor, the voltage or the current from the trimming pad is supplied to the fuse resistor through an MOS transistor, the MOS transistor being turned on at a time of trimming.

(2) According to another aspect of the present invention there is provided a fuse trimming circuit comprising; a CMOS input circuit; a fuse resistor capable of being blown by application of a voltage or a current, for pulling down a level at the input terminal of the CMOS input circuit to a ground level in an unblown state; a trimming pad with the voltage or the current for blowing the fuse resistor supplied thereto; and a MOS transistor for pulling up the level at the input terminal of the CMOS circuit to a power supply level in a state where the fuse resistor is blown. Further, the fuse trimming circuit comprises a MOS transistor capable of being controlled to be turned on/off, which is inserted and connected between the trimming pad and the fuse resistor, provided that at a time of trimming, this MOS transistor is controlled to be turned on.

According to the above-mentioned means, at all other times except the time of the trimming, the MOS transistor arranged between the trimming pad and the fuse resistor is turned off. Further, the parasitic diode of the MOS transistor functions as a static protection diode. Thus, even if static electricity is applied to the trimming pad, the static electricity will not be directly applied to the fuse resistor.

The meritorious effects of the present invention are summarized as follows.

According to the present invention, even when an IC chip is directly mounted on a substrate or trimming is performed after IC packaging, blowing of the fuse resistor due to static electricity can be prevented.

PREFERRED EMBODIMENTS OF THE INVENTION

Figure 1:
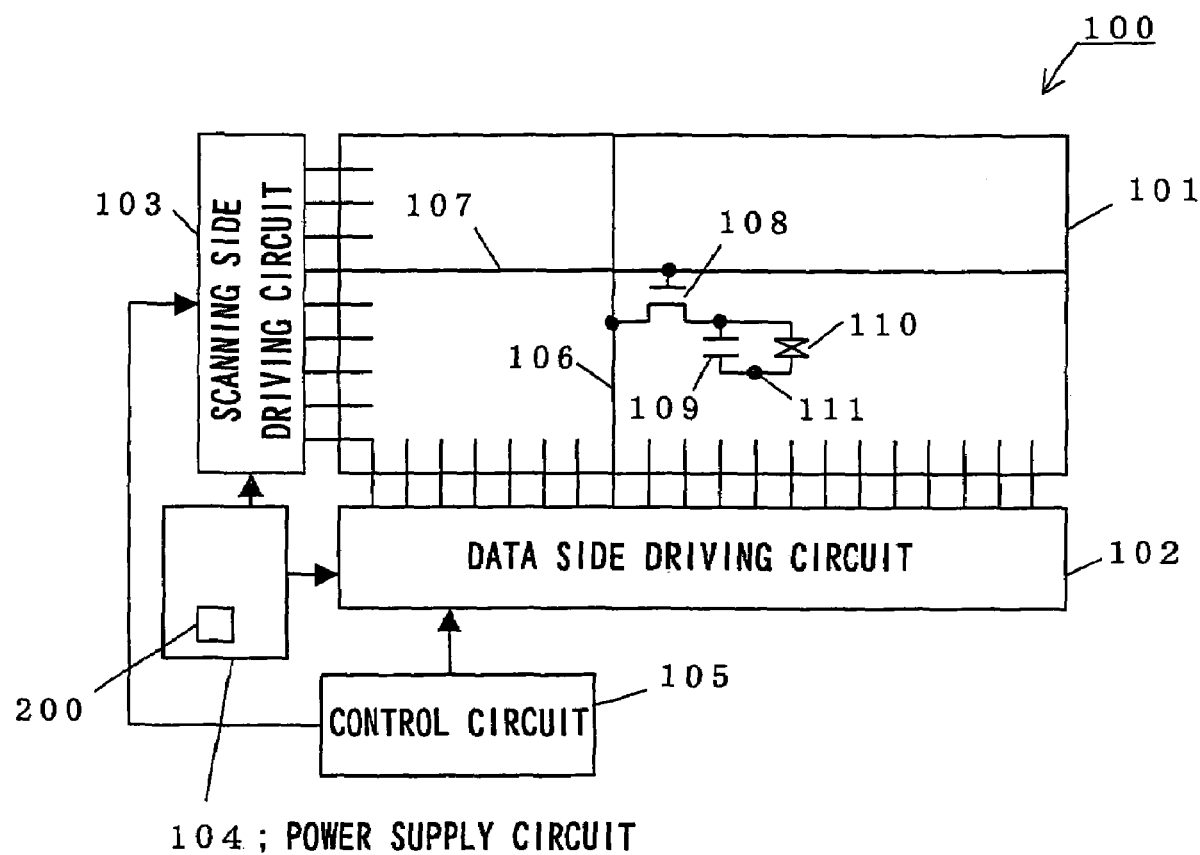
FIG. 1 is a block diagram of a liquid crystal display device 100 in which a fuse trimming circuit according to one embodiment of the present invention is employed.

As a display device for which a fuse trimming circuit of the present invention is employed, a liquid crystal display device will be taken as an example, and will be described with reference to FIG. 1. A liquid crystal display device 100 may be employed as a display device of a portable information device such as a cellular phone or a personal digital assistant, for example. The liquid crystal display device 100 comprises a liquid crystal display panel 101, a data side driving circuit 102, a scanning side driving circuit 103, a power supply circuit 104, and a control circuit 105.

The liquid crystal display panel 101 includes data lines 106 which are arranged in the lateral direction of the drawing and extend in a vertical direction and scanning lines 107 that are arranged in the vertical direction of the drawing and extend in the horizontal direction. Each pixel is constituted from a TFT 108, a pixel capacitance 109, and a liquid crystal element 110. The gate terminal of the TFT 108 and the source (drain) terminal of the TFT 108 are connected to a scanning line 107 and a data line 106, respectively. To the drain (source) terminal of the TFT 108, the pixel capacitance 109 and the liquid crystal element 110 are connected. A terminal 111 of the pixel capacitance 109 and the liquid crystal element 110 on a side that is not connected to the TFT 108 is connected to a common electrode not shown, for example.

The data side driving circuit 102 outputs a signal voltage based on display data, thereby driving the data line 106. The scanning side driving circuit 103 outputs a selection/nonselection voltage for the TFT 108, thereby driving the scanning line 107. The control circuit 105 controls timings of driving by the scanning side driving circuit 103 and the data side driving circuit 102. The power supply circuit 104 generates the signal voltage output by the data side driving circuit 102 and the selection/nonselection voltage output by the scanning side driving circuit 103, for supply to the respective driving circuits. The power supply circuit 104 includes a reference voltage generation circuit 200 in its inside.

Together with the power supply circuit 104, the data side driving circuit 102 and/or the scanning side driving circuit 103 are incorporated into one chip in a semiconductor integrated circuit device (hereinafter referred to as an IC) such as the one comprising the data side driving circuit 102 plus the power supply circuit 104, the scanning side driving circuit 103 plus the power supply circuit 104, or the data side driving circuit 102 plus the scanning side driving circuit 103 plus the power supply circuit 104. The control circuit 105 can also be included in this IC chip. This chip is COG-mounted on the glass substrate of the liquid crystal display panel 101.

Figure 2:
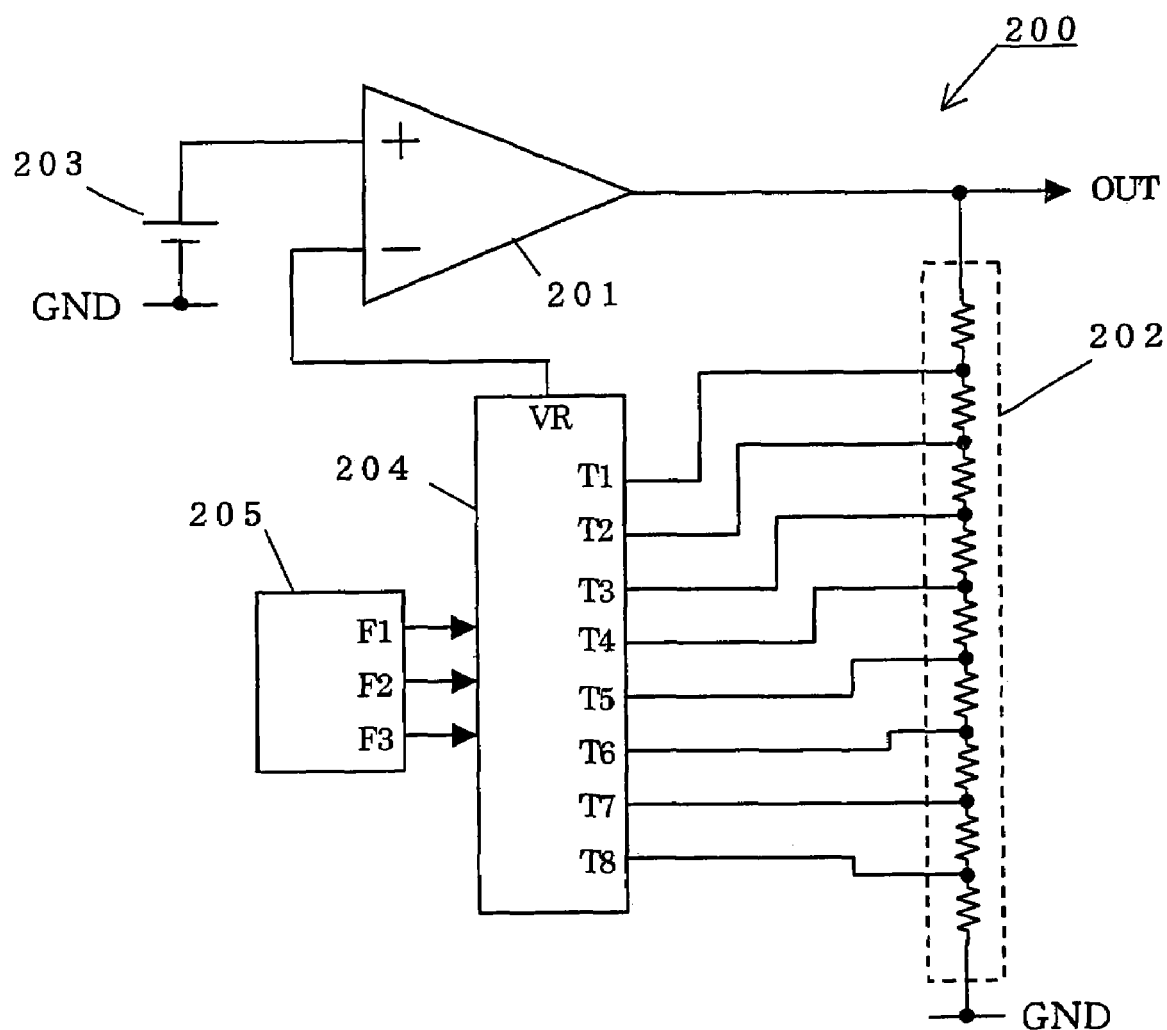
FIG. 2 is a circuit diagram of a reference voltage generation circuit 200 employed in the liquid crystal display device 100 shown in FIG. 1.

Next, the reference voltage generation circuit 200 will be described with reference to FIG. 2. The reference voltage generation circuit 200 includes an amplifier 201, a voltage divider circuit 202, a band-gap reference circuit 203, a selector 204, and a fuse trimming circuit 205. In the fuse trimming circuit 205, a fuse trimming unit that generates one-bit signal determined by whether one fuse is blown or not is constituted from three units, for example. The fuse trimming circuit 205 then supplies signals of three bits to a selector 204. The selector 204 selects an input from one voltage division point among eight voltage division points of the voltage divider circuit 202 according to the logic of the three bit signals from the fuse trimming circuit 205, and supplies the input to the inverting input terminal (−) of the amplifier 201. To the non-inverting input terminal (+) of the amplifier 201, an output from the band-gap reference circuit 203 is supplied.

The reference voltage generation circuit 200 can generate eight types of reference voltages based on the logics of the three bit signals determined by whether three fuses are blown or not, using the fuse trimming circuit 205, and can supply a reference voltage with a high accuracy in the power supply circuit 104.

Figure 3:
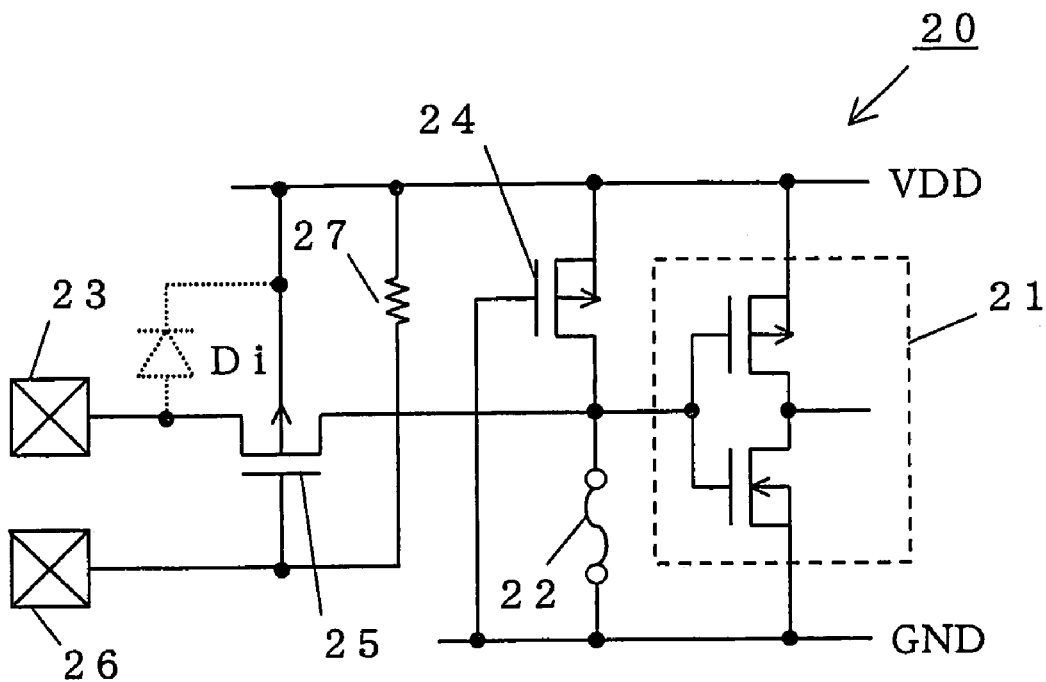
FIG. 3 is a circuit diagram of a fuse trimming circuit 20 according to a first embodiment of the present invention.

With reference to FIG. 3, a description will be directed to a fuse trimming circuit 20 according to the first embodiment of the present invention, which can be employed as a fuse trimming unit in the fuse trimming circuit 205. The fuse trimming circuit 20 includes a CMOS input circuit 21, a fuse resistor 22, a trimming pad 23, a P-channel MOS transistor 24, a P-channel MOS transistor (switching transistor) 25, a control pad 26, and a resistor 27. The fuse resistor 22 can be blown by application of a voltage or a current and pulls down a level at the input terminal of the CMOS input circuit 21 to a ground level GND in an unblown state. The voltage or the current for blowing the fuse resistor 22 is supplied to the trimming pad 23. The P-channel MOS transistor 24 pulls up the level at the input terminal of the CMOS input circuit 21 to a power supply level VDD in a state where the fuse resistor 22 is blown. The P-channel MOS transistor 25 performs electrical connection/disconnection between the trimming pad 23 and the fuse resistor 22. A control signal for controlling the MOS transistor 25 to be turned on is supplied to the control pad 26. The resistor 27 pulls up the gate of the MOS transistor 25 to the power supply level VDD.

The fuse resistor 22 is connected between the input terminal of the CMOS input circuit 21 and a ground line GND. The trimming pad 23 is connected to a connecting point between the input terminal of the CMOS input circuit 21 and the fuse resistor 22 through the MOS transistor (switching transistor) 25. The source of the MOS transistor 24 is connected to a power supply line VDD. The drain of the MOS transistor 24 is connected to the input terminal of the CMOS input circuit 21. The gate of the MOS transistor 24 is connected to the ground line GND. The source of the MOS transistor 25 is connected to the trimming pad 23. The drain of the MOS transistor 25 is connected to the input terminal of the CMOS input circuit 21. The back gate of the MOS transistor 25 is connected to the power supply line VDD. The gate of the MOS transistor 25 is connected to the control pad 26 and is also connected to the power supply line VDD through the resistor 27.

When trimming is unnecessary in the fuse trimming circuit 20, the fuse resistor 22 is not blown. Thus, the input terminal of the CMOS input circuit 21 is fixed as an "L"

level. At this time, the MOS transistor 25 is controlled to be turned off, thereby causing electrical disconnection between the trimming pad 23 and the fuse resistor 22. In addition, a parasitic diode Di of the MOS transistor 25 functions as a static protection diode. Thus, even if static electricity should be applied to the trimming pad 23, the static electricity will not be applied to the fuse resistor 22.

When the trimming is necessary in the fuse trimming circuit 20, the control signal (at the ground level GND) for controlling the MOS transistor 25 to be turned on is supplied to the control pad 26, and a predetermined voltage or current for the trimming is supplied to the trimming pad 23. The fuse resistor 22 is thereby blown. Thus, the input terminal of the CMOS input circuit 21 is fixed at an "H" level.

As described above, the MOS transistor 25 is inserted and connected between the trimming pad 23 and the fuse resistor 22, and at the time of the trimming, the MOS transistor 25 is controlled to be turned on by the control signal from the control pad 26. Thus, at the time of the trimming, electrical connection can be established between the trimming pad 23 and the fuse resistor 22. Then, at all other times except the time of the trimming, electrical disconnection can be performed between the trimming pad 23 and the fuse resistor 22 if the control signal is not supplied to the control pad 26. In addition, the parasitic diode Di of the MOS transistor 25 functions as the static protection diode. With these arrangements, blowing of the fuse resistor 22 due to the static electricity can be prevented.

Figure 4:
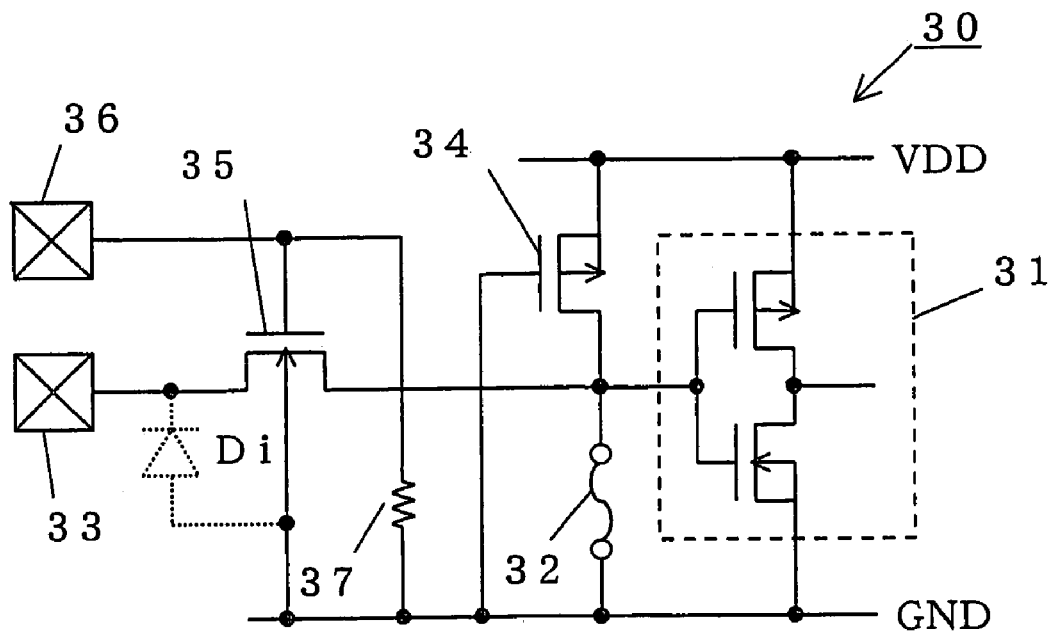
FIG. 4 is a circuit diagram of a fuse trimming circuit 30 according to a second embodiment of the present invention.
Figure 5:
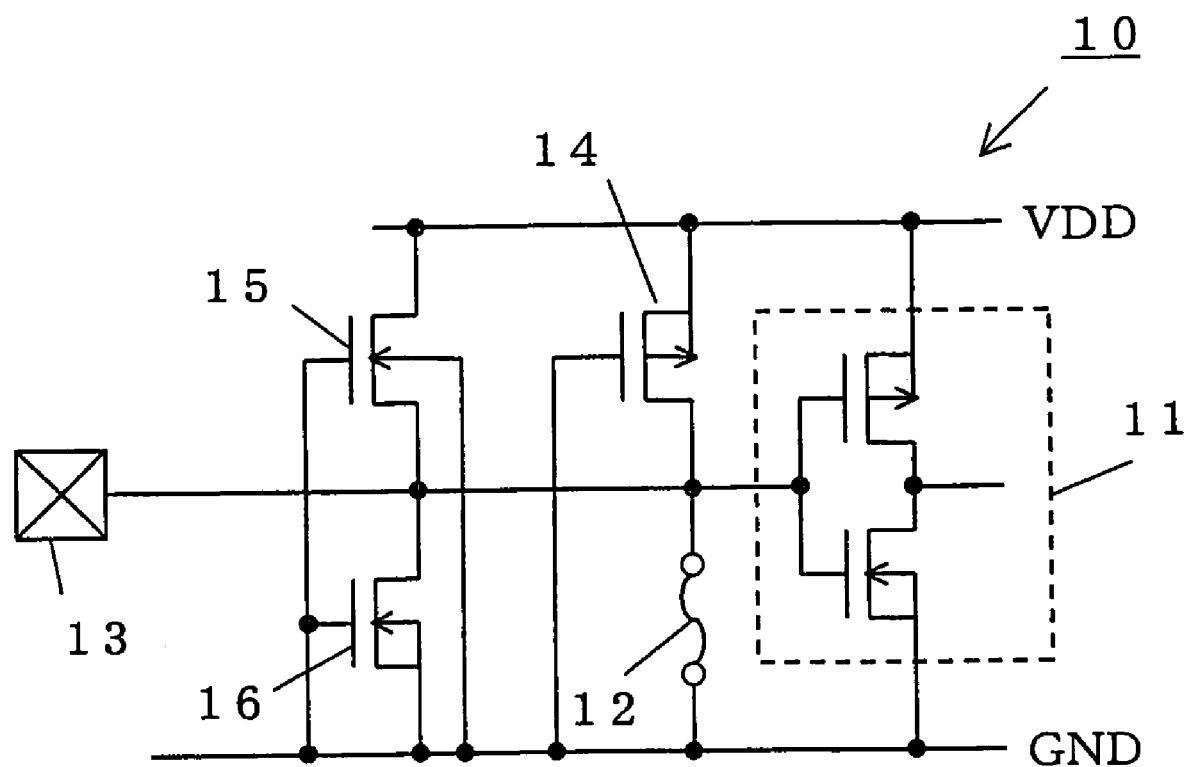
FIG. 5 is a circuit diagram of a conventional fuse trimming circuit 10.

Next, a fuse trimming circuit 30 according to a second embodiment of the present invention will be described with reference to FIG. 4. The fuse trimming circuit 30 includes a CMOS input circuit 31, a fuse resistor 32, a trimming pad 33, a P-channel MOS transistor 34, an N-channel MOS transistor (switching transistor) 35, a control pad 36, and a resistor 37. The fuse resistor 32 can be blown by application of a voltage or a current and pulls down a level at the input terminal of the CMOS input circuit 31 to the ground level GND in an unblown state. The voltage or the current for blowing the fuse resistor 32 is supplied to the trimming pad 33. The P-channel MOS transistor 34 pulls up the level at the input terminal of the CMOS input circuit 31 to the power supply level VDD in a state where the fuse resistor 32 is blown. The N-channel MOS transistor 35 performs electrical connection/disconnection between the trimming pad 33 and the fuse resistor 32. A control signal for controlling the MOS transistor 35 to be turned on is supplied to the control pad 36. The resistor 37 pulls down the gate of the MOS transistor 35 to the ground level GND.

The fuse resistor 32 is connected between the input terminal of the CMOS input circuit 31 and the ground line GND. The trimming pad 33 is connected to a connecting point between the input terminal of the CMOS input circuit 31 and the fuse resistor 32 through the MOS transistor 35. The source of the MOS transistor 34 is connected to the power supply line VDD. The drain of the MOS transistor 34 is connected to the input terminal of the CMOS input circuit 31. The gate of the MOS transistor 34 is connected to the ground line GND. The drain of the MOS transistor 35 is connected to the trimming pad 33. The source of the MOS transistor 35 is connected to the input terminal of the CMOS input circuit 31. The back gate of the MOS transistor 35 is connected to the ground line GND. The gate of the MOS transistor 35 is connected to the control pad 36 and is also connected to the ground line GND through the resistor 37.

When the trimming is unnecessary in the fuse trimming circuit 30, the fuse resistor 32 is not blown. Thus, the input terminal of the CMOS input circuit 31 is fixed as the "L" level. At this time, the MOS transistor 35 is controlled to be turned off, thereby performing electrical disconnection between the trimming pad 33 and the fuse resistor 32. Further, the parasitic diode Di of the MOS transistor 35 functions as a static protection diode. Thus, even if static electricity should be applied to the trimming pad 33, the static electricity will not be applied to the fuse resistor 32.

When the trimming is necessary in the fuse trimming circuit 30, the control signal for controlling the MOS transistor 35 to be turned on is supplied to the control pad 36, and a predetermined voltage or current for the trimming is supplied to the trimming pad 33. The fuse resistor 32 is thereby blown. Thus, the input terminal of the CMOS input circuit 31 is fixed at the "H" level. Incidentally, in this case, it is necessary to make the voltage of the control signal to be supplied to the control pad 36 higher than the voltage to be supplied to the trimming pad 33.

As described above, the MOS transistor 35 is inserted and connected between the trimming pad 33 and the fuse resistor 32, and at the time of the trimming, the MOS transistor 35 is controlled to be turned on by the control signal from the control pad 36. Thus, at the time of the trimming, electrical connection can be established between the trimming pad 33 and the fuse resistor 32. Then, at all other times except the time of the trimming, electrical disconnection can be performed between the trimming pad 33 and the fuse resistor 32 if the control signal is not supplied to the control pad 36. Further, the parasitic diode Di of the MOS transistor 35 functions as the static protection diode. These can prevent the fuse resistor 32 from being blown due to static electricity.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A fuse trimming circuit, comprising:
    a CMOS input circuit connected across a power line and a ground line, and having an input terminal;
    a fuse resistor connected between said input terminal of the CMOS input circuit and the ground line;
    a trimming pad adapted for supplying voltage or current to said fuse resistor and said input terminal of the CMOS input circuit;
    a MOS transistor, connected across the power line and said input terminal, for pulling up the level at said input terminal in a state after said fuse resistor has been blown; and
    a switching transistor connected between said trimming pad and said input terminal, wherein said switching transistor is controlled to be turned on at a time of trimming,
    wherein said switching transistor comprises a switching MOS transistor, whose source is connected to the trimming pad, whose drain is connected to the input terminal, and
    wherein said switching MOS transistor comprises a P-channel MOS transistor, its gate being connected to a control pad and via a resistor to the power line, with its back gate being connected to the power line.

2. A display comprising said fuse trimming circuit as defined in claim 1 in a power supply circuit for the display.

3. A fuse trimming circuit, comprising:
a CMOS input circuit connected across a power line and a ground line, and having an input terminal;
a fuse resistor connected between said input terminal of the CMOS input circuit and the ground line;
a trimming pad adapted for supplying voltage or current to said fuse resistor and said input terminal of the CMOS input circuit;
a MOS transistor, connected across the power line and said input terminal, for pulling up the level at said input terminal in a state after said fuse resistor has been blown; and
a switching transistor connected between said trimming pad and said input terminal, wherein said switching transistor is controlled to be turned on at a time of trimming,
wherein said switching transistor comprises a switching MOS transistor, whose source is connected to the input terminal, and whose drain is connected to the trimming pad, and
wherein said switching MOS transistor comprises a N-channel MOS transistor, its gate being connected to a control pad and via a resistor to the ground line, with its back gate being connected to the ground line.

4. A display comprising said fuse trimming circuit as defined in claim 3 in a power supply circuit for the display.

* * * * *